(12) United States Patent  
Pape

(10) Patent No.: US 8,631,218 B2  
(45) Date of Patent: Jan. 14, 2014

(54) METHOD OF AND SYSTEM FOR CONTROLLING THE PROGRAMMING OF MEMORY DEVICES

(75) Inventor: Lutz Pape, Pinneberg (DE)

(73) Assignee: NXP, B.V., Eindhoven (NL)

(*) Notice: Subject to any disclaimer, the term of this patent is extended or adjusted under 35 U.S.C. 154(b) by 503 days.

(21) Appl. No.: 12/999,432

(22) PCT Filed: May 26, 2009

(86) PCT No.: PCT/IB2009/052185  
§ 371 (c)(1),  
(2), (4) Date: Dec. 16, 2010

(87) PCT Pub. No.: WO2009/153679  
PCT Pub. Date: Dec. 23, 2009

(65) Prior Publication Data  
US 2011/0087852 A1    Apr. 14, 2011

(30) Foreign Application Priority Data  
Jun. 17, 2008 (EP) .................................. 08104433

(51) Int. Cl.  
*G06F 12/00* (2006.01)

(52) U.S. Cl.  
USPC ....... 711/165; 711/103; 711/156; 365/185.33

(58) Field of Classification Search  
USPC .................. 711/165, 103, 156; 365/185.33  
See application file for complete search history.

(56) References Cited

U.S. PATENT DOCUMENTS

| | | | | |
|---|---|---|---|---|
| 6,058,060 A * | 5/2000 | Wong | ............................. | 365/218 |
| 6,160,739 A * | 12/2000 | Wong | ........................ | 365/185.29 |
| 6,426,898 B1 * | 7/2002 | Mihnea et al. | ............. | 365/185.3 |
| 6,493,280 B2 * | 12/2002 | Mihnea et al. | ................ | 365/218 |
| 6,839,287 B2 | 1/2005 | Brucklmayr et al. | | |

(Continued)

FOREIGN PATENT DOCUMENTS

| | | |
|---|---|---|
| DE | 3517087 A1 | 11/1986 |
| EP | 0544252 A2 | 6/1993 |
| GB | 2136992 A | 9/1984 |
| WO | 9933057 A1 | 7/1999 |

OTHER PUBLICATIONS

International Search Report for Application PCT/IB2009/052185 (Jul. 23, 2009).

*Primary Examiner* — Stephen Elmore

(57) ABSTRACT

In order to further develop a method of and a system (100) for controlling the programming of, in particular the erase/write access to, a memory device (10) comprising multiple memory cells (20, 22), said memory cells (20, 22) being exposed to wear resulting from repeated programming, in such way that an increased lifetime of the memory device (10), in particular on an integrated circuit, is provided even under exceptional stress of the memory device (10), it is proposed to provide—at least one quality measuring/determining means (40, 42) being assigned to each memory cell (20, 22) in order to measure and/or to determine the quality of the respective memory cell (20, 22), in particular in order to measure and/or to determine the prospective endurance specified according to a number of change cycles which the respective memory cell (20, 22) can endure within a performance tolerance, and—at least one control means (50), in particular by at least one access load distributor, —being coupled to each quality measuring/determining means (40, 42), and—deciding depending on the measured and/or determined quality of the memory cells (20, 22), which one is selected for programming.

15 Claims, 1 Drawing Sheet

(56) References Cited

U.S. PATENT DOCUMENTS

| | | | |
|---|---|---|---|
| 7,106,629 B2 * | 9/2006 | Chu et al. | 365/185.1 |
| 7,224,612 B2 * | 5/2007 | Tanaka et al. | 365/185.22 |
| 7,692,962 B2 * | 4/2010 | Hamilton et al. | 365/185.03 |
| 2005/0057968 A1 | 3/2005 | Lutze et al. | |
| 2006/0155917 A1 | 7/2006 | Di Sena et al. | |

* cited by examiner

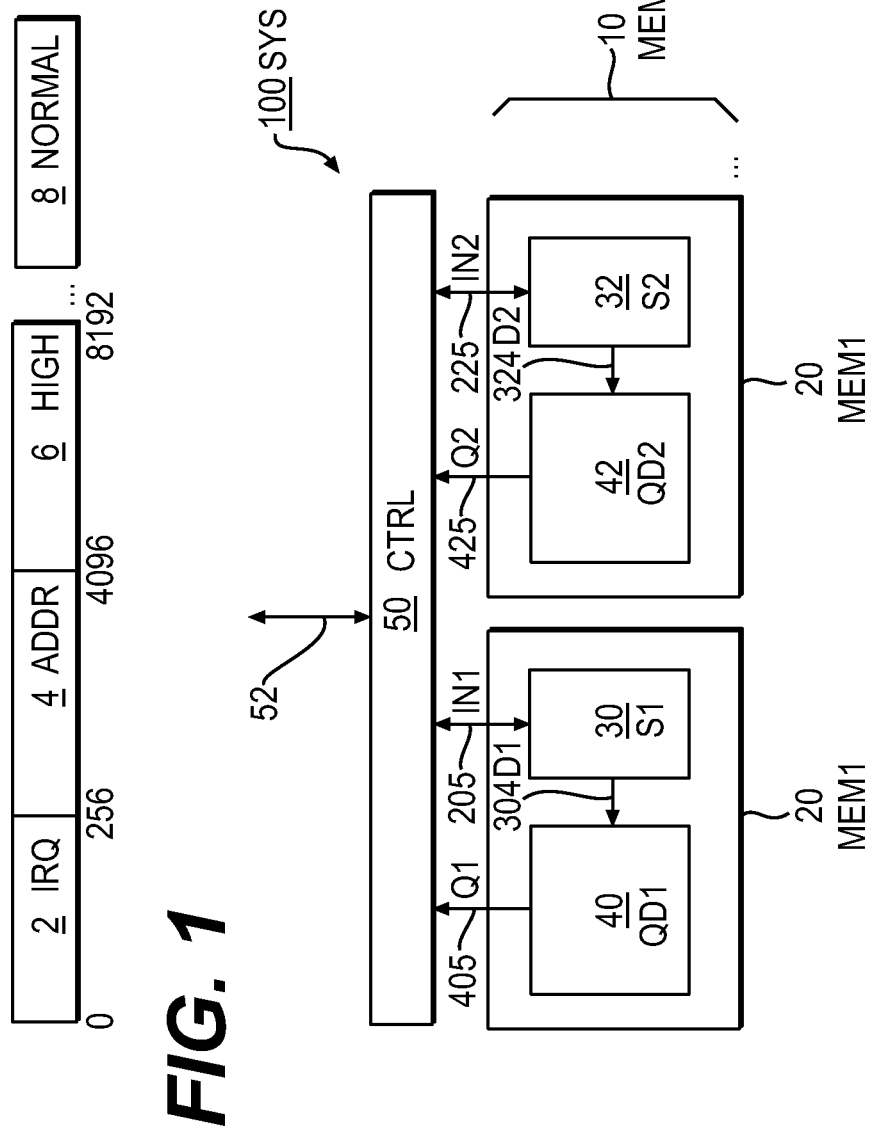

METHOD OF AND SYSTEM FOR CONTROLLING THE PROGRAMMING OF MEMORY DEVICES

BACKGROUND

Secure integrated circuits (ICs) have to provide a fall-back scenario for unsuccessful or broken communication. Data which is rendered invalid must not be transferred into the memory space where it will actually be used by a program.

This feature is most commonly implemented by providing a dedicated transaction buffer. Such buffers are under exceptional read/write access with respect to other EEPROM cells in the system, which makes them vulnerable to failure from exceeding the maximum read/write cycle count of the EEPROM cells. Especially index counter, single bytes or words, are under exceptional stress.

The lifetime of secure integrated circuits is measured in guaranteed read/write cycles to EEPROM memory cells. Due to the nature of the applications running on these integrated circuits, for example, requiring to transmit data securely, some cells are under exceptional stress. The lifetime of the device is then defined by the worst cell in the integrated circuit.

Prior art document DE 35 17 087 A1 discloses an EEPROM divided into at least twice as many memory sectors as required. Two sectors are combined into one memory location. The use of one of the sectors in a memory location is counted and when a threshold is reached, the other sector is selected for use.

Prior art document EP 0 544 252 A2 discloses a memory divided into a number of memory areas. When a request to update data in a memory area is generated, the memory area with the data is compared in erasing cycles to an empty memory area. If the empty memory area has a lower count of erasing cycles the data is written to the empty memory area and the address is changed to this memory area.

Prior art document WO 99/33057 A1 discloses dividing a non-volatile memory into sectors. A sector is composed of subsections. When a write is requested to a sector the appropriate subsection is selected and a counter is incremented counting erasing cycles. When the counter reaches a threshold, the next subsection is used.

Prior art document U.S. Pat. No. 7,363,421 B2 discloses a method for wear leveling of a flash memory. Each block has an erase count and when new data are written, the block with the lowest count is selected.

The above-described processes according to the prior art do not relate to memory cells but relate to memory blocks or to memory devices and are based on counts which have to be stored in a non-volatile way; in this context, a counter for each single memory cell would not be reasonable.

However, with the counts being stored in the controlled sector, namely in the single memory cell which is anyway under exceptional stress, i.e. where most erase/write operations take place, it is not unlikely that this counter memory cell is already of bad or low quality even if other areas of the controlled sector are still of good or excellent quality.

DISCLOSURE

Starting from the disadvantages and shortcomings as described above and taking the prior art as discussed into account, an object of the present invention is to further develop a method as well as a system in such way that an increased lifetime of a memory device, in particular an integrated circuit, is provided even under exceptional stress of the memory device.

The present invention is based on the idea of providing an even load distribution of multiple memory cells, in particular of multiple EEPROM cells, by use of a method and system, in particular of a data management method and of a data management system, for a programming-limited type memory which is programmable a limited number of times and which includes a plurality of storage areas or of memory cells.

Coupled to said control means, in particular to said access load distributing means, is at least one quality measuring/determining means for managing the selection of one of the storage areas or memory cells for which programming has been performed the smallest number of times and for having input data written into the selected one of the storage areas or memory cells, so that all the storage areas or memory cells can be equally programmed thus avoiding a certain storage area or a certain memory cell being subject to an exceptional or maximum stress.

In case of a single address with multiple memory cells when it is requested to erase data from a memory cell and/or to write data to a memory cell, the control means, in particular the access load distributor, determines which memory cell to use, for example depending on the fewest erasing cycles.

According to the present invention, each memory cell is assigned its individual quality measuring/determining means, in particular its individual quality indicator (comprising eight bit, 16 bit, 32 bit, or 64 bit, depending on the respective architecture. Unlike the present invention, the quality indicator in prior art solutions is conventionally related to the memory block or memory device but not to the single memory cell.

According to a particular embodiment, the control means, in particular the access load distributor, decides depending on the quality measurements and/or determinations of the memory cells, which one is used for the programming or access, in particular for the erase/write access.

In expedient way, the memory used cell must be used further on until the quality measurement and/or determination indicates a non-save-quality of the memory used. The cell to use must switch then. According to an advantageous embodiment of the present invention, the memory cells of measured and/or determined bad or low quality must be marked so that these bad memory cells are not to be used anymore.

In a preferred embodiment, the memory cell quality measurement and/or determination may be implemented by counting the programming accesses, especially the erase/write accesses, to the memory cell.

Additionally or alternatively, the quality measurement and/or determination of each memory cell may be implemented in an analog way by measuring the programming voltage or storage voltage in the memory cell (in this context, the datasize of a memory cell is of no concern for this concept: it may be a bit, a byte, a word or whatever width is applicable for a given central processing unit). In this context, the relevant circuit arrangement for measuring and/or determining the programming voltage or storage voltage may be implemented so that providing such single circuit arrangement for each memory cell is worthwhile.

The present invention has the further advantage that no logical circuitry is required outside the memory block or outside the memory device. The design outside the memory block or outside the memory device remains unchanged because the switching process from one memory cell to another memory cell is transparent with respect to the address bus.

Starting from the fact that the dedicated memory area (especially memory array, memory block or memory device) comprises a memory cell implementation with a high endurance (at least higher than that of a normal memory cell), the memory cells in the memory area have an endurance specified according to a number of change (erase/write) cycles which each memory cell can endure within a performance tolerance. These special memory cells are high in cost (mainly due to the silicon space) and have to be kept limited.

The memory cells in this high endurance will be designed in a way, which the actual memory cell uses more than one location to store a value but makes only one location visible to the central processing unit (CPU). The programming accesses, especially the erase/write accesses, to the single memory cell visible to the CPU is distributed evenly over the real memory cells by means of the control means, in particular by means of the access load distributor. This mechanism is transparent to the CPU.

Unlike the present invention, the processes according to prior art are not transparent to the address bus, i.e. the used memory cells are selected via the address on the address bus by means of a component beyond the memory implementation. According to the present invention, the used memory cells are selected within the implementation of a memory cell which is not visible to the address bus; in other words, the switching from one memory cell to another memory cell is immediately performed within the memory cell and remains transparent with respect to the address bus.

The present invention further relates to an integrated circuit memory, in particular to an integrated circuit memory card, comprising at least one system as described above.

The present invention further relates to a computer system comprising at least one integrated circuit memory, in particular at least one integrated circuit memory card, as described above.

The present invention finally relates to the use of a method as described above and/or of at least one system as described above for controlling the programming of, in particular the erase/write access to, at least one integrated circuit memory, in particular at least one integrated circuit memory card, as described above.

BRIEF EXPLANATION OF THE DRAWINGS

As already discussed above, there are several options to embody as well as to improve the teaching of the present invention in an advantageous manner. To this aim, reference is made to the claims, further improvements, features, and advantages of the present invention are explained below in more detail with reference to a preferred embodiment by way of non-limiting example and to the accompanying drawings where FIG. 1 is an exemplary embodiment of a memory layout showing the high endurance memory cells in the address range; and FIG. 2 is an exemplary embodiment of the system according to the present invention, working according to the method of the present invention and comprising high endurance memory cells of FIG. 1.

The same reference numerals are used for corresponding parts in FIG. 1 and in FIG. 2.

DETAILED DESCRIPTION

FIG. 1 exemplifies an embodiment of a memory layout showing the high endurance, programming-limited type semiconductor EEPROM memory cells 20, 22 in the address range and comprising
an interrupt request (IRQ) vector 2,
a bit addressable 4,
a high endurance sector 6, and
normal EEPROMs 8.

Such high endurance memory cells 20, 22 multiplying the number of guaranteed accesses at least by two are contained in a system 100 (cf. FIG. 2) according to the present invention, with such system 100 working according to the method of the present invention.

For controlling the programming of, namely the erase/write access to, a memory device 10 comprising multiple memory cells 20, 22 being exposed to wear resulting from repeated programming, the system 100 comprises at least one quality measuring/determining means 40 or 42 being assigned to the first memory cell 20 or to the second memory cell 22.

The respective quality measuring/determining means 40, 42 is designed for measuring and/or for determining the quality of the respective memory cell 20, 22; in this context, the prospective endurance specified according to a number of change cycles which the respective memory cell 20, 22 can endure within a performance tolerance, is measured and/or determining by the respective quality measuring/determining means 40, 42.

A central control means 50 in the form of an access load distributor exchanges access data 52 with the central processing unit and is coupled to each quality measuring/determining means 40, 42 and decides depending on the measured and/or determined quality of the respective memory cell 20, 22, which one is selected for programming.

Each memory cell 20, 22 further comprises a respective storage area 30, 32 for the input data 205, 225 to be distributed by the control means 50.

In order to measure and/or to determine the quality of the respective memory cell 20, 22, data 304, 324 is transferred from the respective storage area 30, 32 to the respective quality measuring/determining means 40, 42.

In order to enable the control means 50 to decide which storage area 30, 32 is to be used for programming, quality indicator values 405, 425 are transferred from the respective quality measuring/determining means 40, 42 to the control means 50. Since each memory cell 20, 22 is programmable for only a limited number of times, the memory cell quality measurement and/or determination is implemented
by counting the programming accesses, especially the erase/write accesses, to the memory cells 20, 22, or
(in an analog way) by measuring the programming voltage or storage voltage in the memory cells 20, 22.

Since the multiple memory cells 20, 22 differ in their real quality, each memory cell 20, 22 is not switched off until its individual quality has been measured and/or determined to be too poor for use. Consequently, the actual maximum number of possible access cycles or operation cycles, especially of possible erasing/writing cycles, is an estimated number predetermined by the worst memory cell 20, 22.

LIST OF REFERENCE NUMERALS 100 system
2 interrupt request (IRQ) vector of memory layout
4 addressable bit of memory layout 6 high endurance of memory layout
8 EEPROM of memory layout
10 memory block or memory device
20 first memory cell of memory block or of memory device 10
205 input data, for first memory cell 20 having a first storage area 30
22 second memory cell of memory block or of memory device 10
225 input data, for second memory cell 22 having a second storage area 32
30 storage area of first memory cell 20
304 data from first storage area 30 to first quality measuring/determining means 40
32 storage area of second memory cell 22
324 data from second storage area 32 to second quality measuring/determining means 42
40 quality measuring/determining means of first memory cell 20
405 quality indicator value of first memory cell 20 having a first storage area
42 quality measuring/determining means of second memory cell 22
425 quality indicator value of second memory cell 22 having a second storage area 32
50 access load distributor
52 access by central processing unit

The invention claimed is:

1. A method of controlling erase/write access to a memory device comprising multiple memory cells, said memory cells being exposed to wear resulting from repeated programming, the method comprising:
measuring and/or determining a quality of each memory cell according to a number of change cycles which a respective memory cell can endure within a performance tolerance; and
deciding, with an access load distributor, depending on the measured and/or determined quality of the memory cells, which memory cell is selected for programming; and
exchanging access data between the access load distributor and at least one central processing unit.

2. The method according to claim 1, further comprising:
using the selected memory cell until the measured and/or determined quality indicates a non-save-quality; and
switching to another memory cell.

3. The method according to claim 1, further comprising:
marking a memory cell of measured and/or determined bad or low quality; and
preventing subsequent use of said marked memory cell.

4. The method according to claim 1, further comprising:
counting the erase/write accesses to the respective memory cell.

5. The method according to claim 4, further comprising:
selecting a memory cell for which programming has been performed a smallest number of times; and
writing input data into the selected one of the memory cells, so that all memory cells can be equally programmed.

6. The method according to claim 1, further comprising:
measuring the programming voltage or storage voltage in the respective memory cell.

7. The method of claim 1, wherein the quality of each memory is prospective endurance.

8. A system for controlling programming of erase/write access to a memory device comprising multiple memory cells, said memory cells being exposed to wear resulting from repeated programming comprising:
at least one quality measuring/determining device being assigned to each memory cell that is configured to measure and/or to determine a quality of the respective memory cell according to a number of change cycles which the respective memory cell can endure within a performance tolerance; and
at least one access load distributor coupled to each quality measuring/determining device, and configured to decide depending on the measured and/or determined quality of the memory cells, which one is selected for programming, and exchange access data with at least one central processing unit.

9. The system according to claim 8, such that the memory cell comprises:
at least one semiconductor electrically erasable programmable read-only memory (EEPROM) module.

10. The system according to claim 8, comprising:
at least one storage area being assigned to each memory cell, said storage area being provided for input data, being distributed by the access load distributor.

11. The system according to claim 8, comprising transferring data from the respective storage area to the respective quality measuring/determining device in order to measure and/or to determine the quality of the respective memory cell.

12. The system according to claim 8, comprising at least one quality indicator value from the respective quality measuring/determining device to the access load distributor in order to enable the access load distributor to decide which memory cell is used for the programming.

13. An integrated circuit memory including an integrated circuit memory card, comprising at least one system according to claim 8.

14. A computer system comprising at least one integrated circuit memory according to claim 13.

15. The system of claim 8, wherein the quality of the respective memory cell is prospective endurance.

* * * * *